(12) United States Patent
Nishimura et al.

(10) Patent No.: US 8,337,682 B2
(45) Date of Patent: Dec. 25, 2012

(54) ARC PLASMA SOURCE (75) Inventors: Kazuya Nishimura, Kyoto (JP); Katsuhiro Tsuji, Kashiwazaki (JP)

(73) Assignees: Kabushiki Kaisha Riken, Tokyo (JP); Nissin Electric Co., Ltd., Kyoto (JP)

( * ) Notice: Subject to any disclaimer, the term of this patent is extended or adjusted under 35 U.S.C. 154(b) by 516 days.

(21) Appl. No.: 12/529,604

(22) PCT Filed: Feb. 15, 2008

(86) PCT No.: PCT/JP2008/052506
§ 371 (c)(1),
(2), (4) Date: Sep. 2, 2009

(87) PCT Pub. No.: WO2008/108149
PCT Pub. Date: Sep. 12, 2008

(65) Prior Publication Data
US 2010/0101947 A1    Apr. 29, 2010

(30) Foreign Application Priority Data

Mar. 2, 2007    (JP) .................................. 2007-052550

(51) Int. Cl.
*C23C 14/32* (2006.01)
(52) U.S. Cl. .............................. 204/298.41; 204/192.38
(58) Field of Classification Search ............. 204/298.41, 204/192.38
See application file for complete search history.

(56) References Cited

FOREIGN PATENT DOCUMENTS

| JP | H02-038463 | 2/1990 |
| JP | 2001-181829 | 7/2001 |
| JP | 2002-030422 | 1/2002 |
| JP | 2005-126737 | 5/2005 |
| WO | WO2008-108149 | 9/2008 |

OTHER PUBLICATIONS

Machine Translation of JP 2001-181829, by Okazaki. Published Jul. 3, 2001.*
Notification of Transmittal of Translation of the International Preliminary Report on Patentability corresponding to International Application No. PCT/JP2008/052506 dated Sep. 17, 2009.
International Search Report corresponding to International Patent Application No. PCT/JP2008/052506 dated May 20, 2008.

* cited by examiner

*Primary Examiner* — Keith Hendricks
*Assistant Examiner* — Jason M Berman
(74) *Attorney, Agent, or Firm* — Jenkins, Wilson, Taylor & Hunt, P.A.

(57) ABSTRACT

An arc plasma source 101 for evaporating a cathode material of a cathode 22 by arc discharge controlled by a magnetic field, comprising a magnetic field forming mechanism 42 arranged outside the cathode for forming a magnetic field M in parallel to the center axis of the cathode near an evaporation surface 22a; a supporting mechanism 26 for supporting the cathode; a cooling mechanism 61 for cooling the cathode; and a tapered ring 64 being truncated cone shaped and having a through-hole into which the cathode penetrates along the axial direction of the through-hole, the tapered ring being arranged to be tapered toward the evaporation surface of the cathode; wherein the tapered ring is made of a ferromagnetic material and the front end of the tapered ring is positioned coplanar with the evaporation surface of the cathode or is positioned posterior to the evaporation surface in use.

10 Claims, 5 Drawing Sheets

ARC PLASMA SOURCE

FIELD OF THE INVENTION

The present invention relates to an arc plasma source for forming a hard carbon film to improve wear resistance, reducing friction loss, or adding color, on an outer surface of a substrate, e.g., a tool, a metal mold, an ornament, and mechanical components etc.

DESCRIPTION OF THE RELATED ART

In a vacuum chamber, an arc plasma source for melting and evaporating a cathode material by arc discharge is used for depositing a film on an outer surface of a substrate in order to improve wear resistance and durability, reduce friction loss, and keep a surface shape. In the vacuum arc plasma source, the evaporated cathode material is mostly ionized by arc plasma formed in a forward space of a cathode by arc discharge. Then, the ionized cathode material is attracted to the substrate by applying a predetermined bias voltage and a film is formed on a surface of the substrate.

Since an arc ion plating method using such an arc plasma source can generate a large amount of vapor of the cathode material by melting the cathode material using arc discharge, the arc ion plating method has a high deposition rate and excellent adhesion between a film and a substrate. Therefore, since a deposition apparatus applying this method has excellent productivity, the apparatus has been widely used for depositing a film of a metal, or carbide and nitride of a metal on a surface of a machine part or a cutting tool.

The arc plasma source uses a magnetic field formed by a permanent magnet or a coil, and controls the magnetic field so as to set an arc spot by the arc discharge on an evaporation surface in front surface of the cathode. However, the arc spot may occasionally move to the outside of the cathode evaporation surface.

Figure 5:
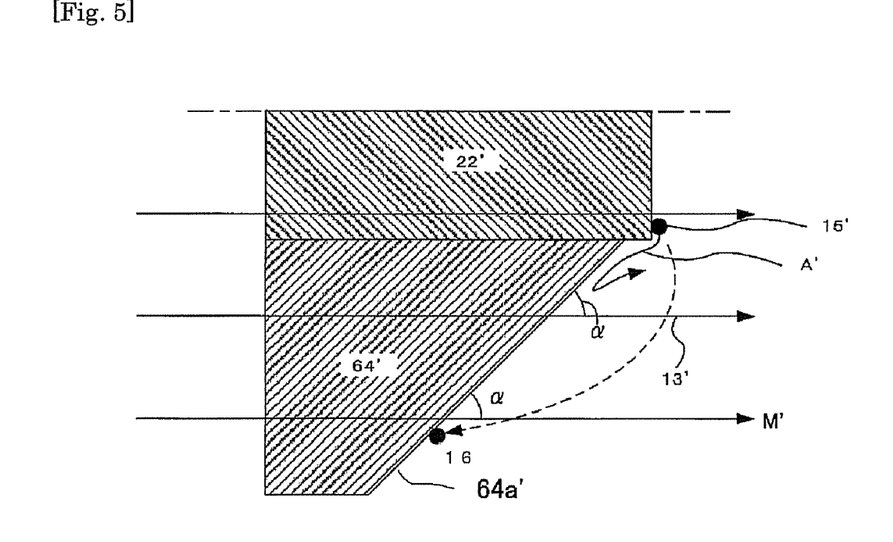
FIG. 5 is a view showing a magnetic field formed by a conventional arc plasma source and movement of an arc spot.

Thus, as a technology for suppressing movement(transfer) of the arc spot, an arc evaporation source including a tapered ring surrounding a cathode evaporation surface and having a conical slope at least at an anterior part thereof is disclosed (FIGS. 1 to 3 in Patent Document 1). This technology uses a characteristic that an arc spot in a line of magnetic force advances toward a direction having an acute angle between the line of magnetic force and the conical slope. In this case, as illustrated in FIG. 5, a line of magnetic force M' generated approximate-perpendicularly to the cathode evaporation surface by a coil has an acute angle α with a conical slope 64'a of the tapered ring 64'. Therefore, according to the above-mentioned characteristic, the arc spot deviated from the cathode evaporation surface and migrating to the tapered ring slope is returned to the cathode evaporation surface along a trajectory A' illustrated in FIG. 5.

Further, a technology forming a thin ring-shaped inner layer around a material rod as a deposition material and making this inner layer from a magnetic material is disclosed (FIG. 3 in Patent Document 2). In this embodiment, a line of magnetic force is attracted from the magnetic material to the inner layer and spreads a plasma beam. Thus, an upper surface of the material rod is heated relatively-uniformly and steady deposition is acquired.

Furthermore, a technology to provide a cathode shield made of a ferromagnetic material around a cathode is disclosed (FIG. 1 of Patent Document 3).

[Patent Document 1] Japanese Patent Application Laid-Open No. 2001-181829 (FIGS. 1 to 3, Paragraph [0020])

[Patent Document 2] Japanese Patent Application Laid-Open No. 2002-30422 (FIG. 3, Paragraph [0030])

[Patent Document 3] Japanese Utility Model Application Laid-Open No. H02-38463 (FIG. 1)

Problems to be Solved by the Invention

However, according to the technology disclosed in the patent document 1, the tapered ring is made of a conductive material having a potential equal to cathode potential. Thus, when the arc spot deviated outside the cathode evaporation surface and moves to the conical slope of the tapered ring, the slope (particularly the front end of the slope near the cathode evaporation surface) is evaporated and consumed by arc discharge. And when the slope of the tapered ring is consumed, the angle between the slope and the line of magnetic force is no longer an acute angle, and an effect of returning the arc spot to front surface of the cathode is reduced. Thus, the ring needs to be exchanged periodically.

Further, when arc discharge current is large or when a carbon-based or Cr-based high melting point material is used as a cathode, melted high temperature fine particles (droplets) can be scattered from the cathode. When these droplets pass through the plasma, these droplets may be negatively charged because electrons are adhered to the droplets. However, since its comparatively large mass, these droplets can move substantially without being affected by a magnetic field and reach the tapered ring surface. At this time, since these droplets have high temperature and are negatively charged, the temperature on the tapered ring surface instantaneously becomes high, and the charged electrons are discharged at the tapered ring side so as to work equally to a trigger used when starting arc discharge. In this case, the arc discharge moves discontinuously changing a place and thus, even when the tapered ring is provided, the droplets go over the tapered ring and scatters to an arbitrary place having the potential equal to the cathode potential, and the arc discharge is made to move. As a result, a cathode constituent material is deposited with comparatively low adhesion on the side surface of the cathode or the surface of the tapered ring. Then, the material is exfoliated and scattered again, and adhered to the surface of a film so as to form an extremely thin film thickness part, or the material is involved in the film so as to reduce the smoothness of the film surface and the film hardness. Furthermore, exfoliated and scattered sediment can be adhered to the component parts of a deposition apparatus and causes various problems.

The technology disclosed in the patent document 2 has a system in which a plasma source as a cathode is placed at a position different from an evaporation source and a plasma beam is introduced into a film material as an anode. Thus, the plasma beam is directly attracted from the cathode to the anode. Therefore, this technology is different from the technology described in the patent document 1 in which a film material is biased on the cathode side, and thus there is originally no problem that the arc spot moves to the outside of the evaporation surface of the film material. Thus, it is hard to apply the technology disclosed in the patent document 2 in order to improve movement of the arc spot.

In the patent document 3, a cathode shield made of a ferromagnetic material is formed around a cathode. Further, this document discloses that a cathode shield surface is covered with a covering material made of the same material as that of the cathode. The reason is that the covering material prevents the cathode shield from partially melting or evaporating due to the movement of arc discharge. However, according to this technology, since the cathode shield is parallel to the cathode surface, the covering material is consumed by the moved arc discharge and thus processes and costs for periodically exchanging parts or re-covering of the cathode becomes necessary. Thus, there is a problem that the cost for coating is increased.

Accordingly, the object of the present invention is to provide an arc plasma source with suppressing movement of an arc spot to a portion other than a cathode evaporation surface.

SUMMARY OF THE INVENTION

This invention is conducted for solving aforementioned problems. An aspect in accordance with the present invention provides an arc plasma source for evaporating a cathode material of a cathode by arc discharge controlled by a magnetic field, the source comprising:

the cathode;

a magnetic field forming mechanism arranged outside the cathode for forming a magnetic field in parallel to the center axis of the cathode near an evaporation surface at the front end of the cathode;

a supporting mechanism for supporting the cathode;

a cooling mechanism for cooling the cathode; and a tapered ring being truncated cone shaped and having a through-hole into which the cathode penetrates along the axial direction of the through-hole, the tapered ring being arranged to be tapered toward the evaporation surface of the cathode;

wherein the tapered ring is made of a ferromagnetic material and the front end of the tapered ring is positioned coplanar with the evaporation surface of the cathode or is positioned posterior to the evaporation surface in use.

In this embodiment, since the tapered ring is made of a ferromagnetic material, a line of magnetic force is bent and a line of magnetic force spreading outward is formed around a cathode outer peripheral surface. In addition, a magnetic flux density becomes high at the front end of a tapered ring and an effect of returning an arc spot to the cathode evaporation surface increases, and thus movement of the arc spot to a conical face of the tapered ring can be suppressed.

It is preferable that an insulating material is provided on the surface of the conical face of the tapered ring. Further, it is preferable that a ring-shaped cover made of a paramagnetic metal or a paramagnetic alloy is provided anterior to the conical face of the tapered ring, wherein the ring-shaped cover has a through-hole into which the cathode penetrates along the axial direction of the through-hole, and the ring-shaped cover is electrically insulated from other parts.

In these embodiments, even when high temperature negatively charged droplets are scattered and reaches a portion near the conical face (slope) of the tapered ring, a tapered ring cover or an insulating material covers the conical face. Thus, even when electrons adhered to the droplet surfaces are discharged, the discharge does not work as a trigger and movement of the arc discharge does not occur, and the conical face is not consumed.

It is preferable that the magnetic forming mechanism comprises either of a coil, a cylindrical permanent magnet having a magnetic pole in an axial direction, or an electromagnet consisting of an iron core and a coil. It is preferable that the arc plasma source further comprises a cathode feeding mechanism moving backward and forward the cathode in its axial direction.

According to the present invention, movement of an arc spot to a portion other than a cathode evaporation surface can be certainly suppressed. Further, when a cover is provided anterior to the conical face, consumption of members is reduced even when the arc spot moves to the portion other than the cathode evaporation surface.

DESCRIPTION OF THE PREFERRED EMBODIMENTS

First Embodiment

Figure 1:
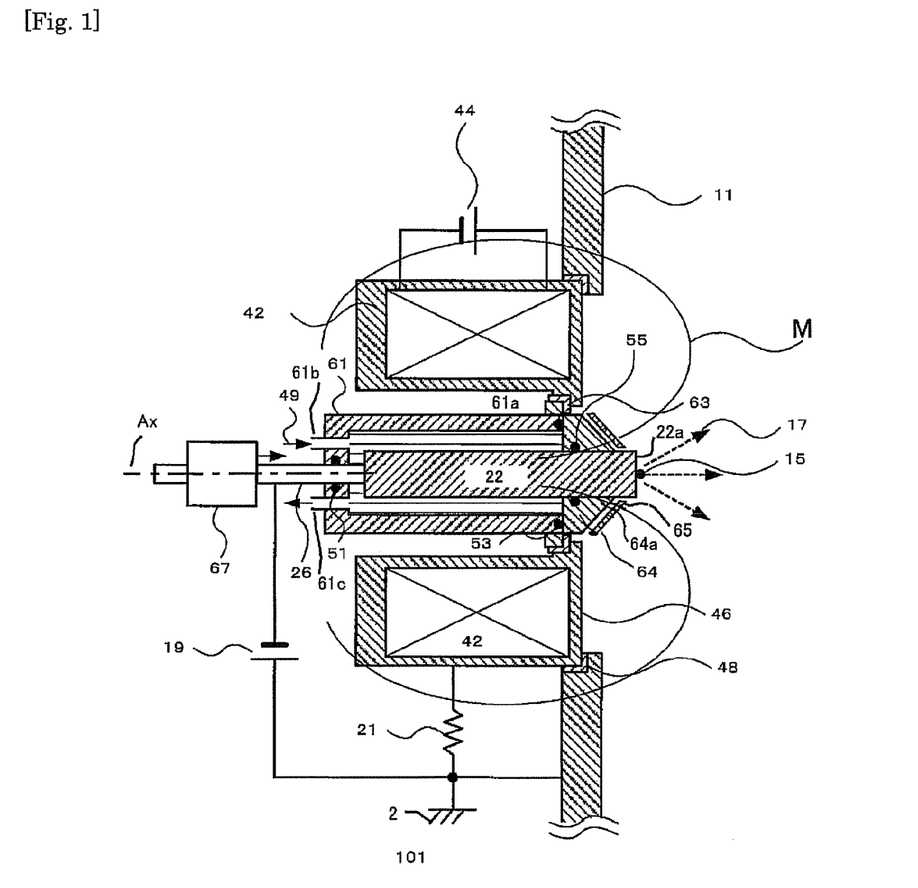
FIG. 1 is a cross-sectional view showing an arc plasma source of a first embodiment of the present invention.

Preferred embodiments of the present invention will be described in detail below with reference to the drawings. FIG. 1 is a cross-sectional view showing one example of the first embodiment of an arc plasma source of the present invention.

An arc plasma source 101 is set up at an opening part of a vacuum chamber 11 (only a part of a chamber wall is shown in FIG. 1) and these configure an arc evaporation apparatus as a whole. The arc plasma source 101 includes a magnetic field forming mechanism (a coil) 42, a rod shaped supporting mechanism 26 for supporting a cylindrical cathode 22, a cathode feeding mechanism (a stepping motor) 67, a cooling mechanism 61 for cooling the cathode, and a tapered ring 64 made of a ferromagnetic material. The ring-shaped coil 42 is housed in a ring-shaped coil housing case 46 which is slightly larger than the coil 42, and the coil housing case 46 also works as an intermediate potential electrode as described below.

The cooling mechanism 61 has a bottomed cylindrical shape having an outer diameter which is slightly smaller than the inner diameter of the coil housing case 46 and a flange part 61a spreading outward is formed on the opening edge side of the cooling mechanism 61. The tapered ring 64 having a truncated conical shape and the same diameter of the cooling mechanism 61 is attached to the opening edge of the cooling mechanism 61. The bottom surface (plane) side of the tapered ring 64 is opposed to the opening edge of the cooling mechanism 61, and a conical face (slope) of the tapered ring 64 is protruded so as to be tapered from a leading edge of the cooling mechanism 61. On the other hand, a center hole through which the supporting mechanism 26 being inserted is opened at a center of the bottom surface of the cooling mechanism 61, and an inlet 61b and an outlet 61c which let a coolant 49 to enter in and go out an internal space of the cooling mechanism 61 are provided outside of the center hole.

The coolant 49 directly contacts the cathode 22 and the tapered ring 64 and cools these. When the cathode 22 and the tapered ring 64 are cooled, these temperatures can be kept constantly and thus a deposition rate is kept constantly and a reproducibility of a film thickness is improved. Particularly, when the coolant 49 directly contacts the cathode 49 and the tapered ring 64, the effect is exerted more.

The tapered ring 64 has a through-hole which makes the cathode 22 to penetrate along the axial direction of the through-hole. The cathode 22 is inserted into the cooling mechanism 61 from the through-hole, and the front end of the supporting mechanism 26 inserted from the bottom surface side of the cooling mechanism 61 is coaxially connected with the back end face of the cathode 22. Therefore, the cathode 22 is supported by an edge part of the through-hole of the tapered ring 64 and the supporting mechanism 26.

Another end of the supporting mechanism 26 is attached to the cathode feeding mechanism 67, and the supporting mechanism 26 and the cathode 22 move backward and forward in an axial direction in the cooling mechanism 61 corresponding to the backward and forward traveling of the cathode feeding mechanism 67.

Further, in order to prevent the leakage of the coolant 49, O-rings 51, 53, and 55 are interposed at a sliding portion between the supporting mechanism 26 and the center hole of the cooling mechanism 61, at a joint portion of the opening edge of the cooling mechanism 61 and the bottom surface of the tapered ring 64, and at a sliding portion between the cathode 22 and the through-hole of the tapered ring 64.

In addition, when a diameter of the through-hole of the tapered ring 64 is approximately equal to a diameter of an upper surface of the truncated cone, the front end 64a of the conical slope of the tapered ring 64 is protruded sharply. And in this case, movement of an arc spot described below is preferably controlled.

Further, in this embodiment, an umbrella shaped tapered ring cover 65 having a diameter approximately equal to that of the tapered ring 64 and having a through-hole is arranged anterior to the tapered conical face of the tapered ring 64. The cathode 22 is inserted through that through-hole. The tapered ring cover 65 is attached to the conical face of the tapered ring 64 via a ceramics bush, which is not shown in the drawings, and electrically insulated from other parts (the tapered ring 64, the cathode 22, component parts of the arc plasma source 101, the vacuum chamber 11, and the like). In addition, the diameter of the through-hole of the tapered ring cover 65 is slightly larger than the diameter of the through-hole of the tapered ring 64.

The tapered ring cover 65 is made of a paramagnetic SUS304 but any paramagnetic metals and alloys can be used. Further, as for the insulating material for attaching the tapered ring 64 and the tapered ring cover 65, ceramics having high insulating property, e.g., alumina, silicon nitride, zirconia, or the like, can be used.

Further, in a deposition operation of a film, the position of the cathode 22 is carried forward and backward to position the front end 64a of the tapered ring 64 coplanar with the evaporation surface 22a of the cathode or to position the front end 64a slightly posterior to the evaporation surface 22a. This is because when the front end 64a of the tapered ring 64 is positioned anterior to the evaporation surface 22a of the cathode (on the inner side of the vacuum chamber), arc discharge is kept not at the cathode but at the tapered ring to cause a problem of the film quality.

However, when the tapered ring cover 65 is positioned anterior to the cathode 22, there also is a problem that a vaporized material is deposited to and exfoliated from the cover. Thus, both the tapered ring 64 and the tapered ring cover 65 are positioned posterior to the cathode evaporation surface 22a.

In addition, the cathode is consumed according to a long-term use and the evaporation surface 22a being retreated toward the outer direction of the vacuum chamber. Thus, to anticipate this retreating, it is preferable to feed the cathode 22 frontward using the cathode feeding mechanism 67 and stabilize evaporation so as to keep deposition rate and film quality constantly. However, when deposition treatment time is short or consumption rate of the cathode is low because discharge current is small, it is possible that the cathode evaporation surface 22a is positioned anterior to the front end of the tapered ring 64 at a time of the deposition treatment even if the cathode feeding mechanism is not provided.

As for fixing the arc plasma source 101 to the vacuum chamber, for example, an insulation ring 48 is fitted over one edge of the coil housing case 46 in its axial direction, next the coil housing case 46 is inserted into the vacuum chamber 11 with the insulation ring 48 is interposed between the edge of the coil housing case 46 and an opening edge of the vacuum chamber 11.

Then, an insulation ring 63 is fitted over the flange part 61a of the cooling mechanism 61, next an assembly (the cathode 22, the supporting mechanism 26, the tapered ring 64, the tapered ring cover 65, and the cathode feeding mechanism 67 is incorporated into the assembly) including the cooling mechanism 61 discussed above is housed in the coil housing case 46 with the insulation ring 63 is interposed between the flange part 61a and an edge of an inner wall of the coil housing case 46. In this case, the axial direction of the cooling mechanism 61 is aligned with the axial direction of the coil housing case 46, and thus the arc plasma source 101 is set up.

In addition, the insulation rings 48 and 63 are functioned as insulation and vacuum sealing.

In the arc plasma source 101 set up at the vacuum chamber 11, it is preferable that the cathode evaporation surface 22a is positioned (e.g. on the inner side of the vacuum chamber) anterior to the structures (e.g., a front end surface of the coil housing case 46) of an inner wall surface of the vacuum chamber 11 and structures such as a magnetic field forming mechanism which configure the arc plasma source 101. When a wall surface or a structure is placed anterior to the cathode evaporation surface 22a, a cathode constituent material evaporated by arc discharge (a reference numeral 17 in FIG. 1 shows a flow of an evaporated or ionized cathode constituent material) may be deposited on the wall surface and the structure surface. Further, the deposited cathode constituent material may be exfoliated and scattered in a depositing operation due to its internal stress or the like. The material may be adhered to the surface of a substrate to be deposited so as to prevent forming the film, or mixed into the film so as to reduce quality of the film.

Then, an operation for depositing a film using the arc plasma source 101 will be described. A cathode of an arc discharge current power source 19 is electrically connected with the supporting mechanism 26 having an electric conductivity and the supporting mechanism 26 is electrically connected with the cathode 22. On the other hand, an anode side of the arc discharge current power source 19 and the vacuum chamber 11 are connected with a ground 2. Further, the coil housing case 46 having electric conductivity is connected with the ground 2 via a resistor 21 so as to function as an intermediate potential electrode. Thus, arc discharge is generated between the cathode 22 and the vacuum chamber 11, and between the cathode 22 and the coil housing case 46, and the evaporated and ionized cathode constituent material spring toward a predetermined anode direction (connected with the ground 2) from the evaporation surface 22a of the cathode to form a film on a substrate surface (not shown in the drawings) in the vacuum chamber 11.

On the other hand, the coil 42 is connected with an exciting power source 44. The coil 42 generates a magnetic field parallel to the axial direction of the coil housing case 46 (equal to a central axis Ax of the cathode 22) to move an arc spot toward the cathode evaporation surface 22a.

As the cathode 22, a solid core circular shape is preferably used. Further, it is preferable if a conductive and not a ferromagnetic material is used as the cathode 22, since a magnetic field coordination formed at the front end of the tapered ring 64 is not affected even when an amount of protrusion of the cathode or a length of the cathode is changed. As for a material of the cathode 22, a metal, an alloy, a semi-metal material such as carbon or the like, and a semiconductor material such as InAs or the like can be mentioned. Particularly, when not a ferromagnetic metal is used, a material including at least one kind of metal carbide, metal nitride, metal boride, and metal sulfide can be preferably used. As for such a metal, at least one kind selected from the group consisting of Ti, V, Cr, Al, Nb, Zr, Mo, W, Hf, and Ta can be mentioned.

The tapered ring 64 is made of a ferromagnetic material including, for example, iron, nickel, cobalt, or an alloy mainly composed of them. From the viewpoints of the easily availability of material and a fabrication cost, a ferromagnetic iron-based material is preferably used as the tapered ring 64.

In addition, in each embodiment of the present invention, the magnetic field forming mechanism has "a cylindrical shape", but is not limited in this shape. For example, a cylindrical substance having a polygonal cross section can be used if it has a tubular shape. On the other hand, a shape of the cathode is also not limited, and a polygonal pillar shape can be used instead of the circular pillar shape. Further, a cross-sectional shape of a tube of the magnetic field forming mechanism can be similar to or different from a cross-sectional shape of the cathode. However, from the viewpoints of symmetry of magnetic fields to be formed, it is preferable that both the cross-sectional shapes are similar (for example, a cathode is cylindrical column-shaped when a magnetic field forming mechanism is cylindrical).

Further, an axis of the magnetic forming mechanism can be co-axial with or different from an axis of the cathode. However, from the view point of symmetry of magnetic fields to be formed, it is preferable that these axes are co-axial.

Effect by a Tapered Ring

An effect acquired using the ferromagnetic tapered ring in the present invention will be described. The effect acquired using not the ferromagnetic tapered ring but the conductive (paramagnetic) tapered ring is already described in FIG. 5, and the aforementioned patent document 1 also discusses the effect.

However, as discussed before, in the case of using a paramagnetic tapered ring, when an arc spot deviated from the cathode evaporation surface moves to a conical slope of the tapered ring, a slope (particularly the front end of the slope near the cathode evaporation surface) is evaporated and consumed by arc discharge. When the slope of the tapered ring is consumed, the angle between the slope and a line of magnetic force is not to be acute, and the effect of returning the arc spot to the cathode evaporation surface is reduced. Thus, the ring needs to be exchanged periodically.

In the present invention, the direction of the line of magnetic force is changed by using the ferromagnetic tapered ring, and further a magnetic flux density at the front end of the tapered ring is made to be high. Thus, the effect of returning the arc spot to the cathode evaporation surface is improved greatly and movement itself of the arc spot to the conical face of the tapered ring can be suppressed.

It has been known that when a ferromagnetic material is arranged in a magnetic field at a temperature fully lower than a curie point, the ferromagnetic material shows a characteristic to interact mutually with the magnetic field so as to attract a line of magnetic force, different from a case of a paramagnetic material. Further, when the ferromagnetic material has an acute front end in a direction of the line of magnetic force, the magnetic flux density at the front end becomes high. In the present invention, the direction of the line of magnetic force is changed as shown in FIG. 2 utilizing these characteristics.

Figure 2:
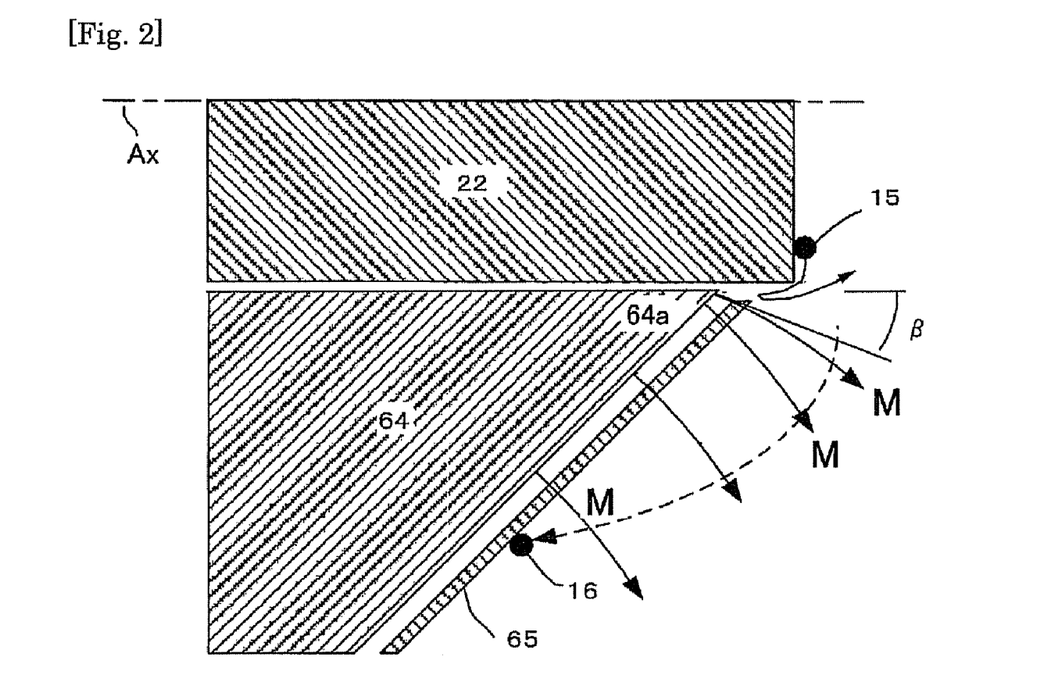
FIG. 2 is a view showing a magnetic field formed by the arc plasma source of the first embodiment and movement of an arc spot.

FIG. 2 shows the direction of the line of magnetic force and the movement of the arc spot when the ferromagnetic tapered ring 64 is used. The line of magnetic force which enters in parallel to the cathode axis Ax is bent by the ferromagnetic tapered ring because of the aforementioned characteristics. At this time, the line of magnetic force which spreads toward the forward and outer peripheral direction of the cathode is formed at the outer peripheral surface of the cathode. Further, an angle between the cathode side face and the line of magnetic force becomes the acutest angle β anterior to the cathode, and the force of returning the arc spot to the cathode evaporation surface is applied because of the characteristic that the arc spot advances toward the direction in which the angle between the cathode surface and the line of magnetic force is acute.

On the other hand, in the conventional technology (the patent document 1), the acute angle α defined between the line of magnetic force M' and the front of the tapered ring surface makes the arc spot to return to the evaporation surface according to the characteristic that the arc spot advances toward the direction of the acute angle between the cathode surface and the line of magnetic force, as shown in FIG. 5. However, in the conventional technology, when one focuses attention on a portion of the tapered ring which is adjacent to the cathode outer periphery (a portion which is the nearest to the cathode outer periphery), the line of magnetic force M' parallel to the axis of the cathode and the portion near the cathode outer periphery do not basically form an angle. Therefore, there is no effect of returning the arc spot to the cathode evaporation surface at this portion, and the portion which contributes to advance the arc spot in the acute angle direction is only the portion having the acute angle α formed on the front side of the slope of the paramagnetic tapered ring and the line of magnetic force M'.

By contrast, in the present invention, since the line of magnetic force is bent outwardly by the ferromagnetic tapered ring, the cathode outer periphery and the line of magnetic force forms an acute angle β on the front side at a portion adjacent to the cathode outer periphery (the portion nearest to the cathode outer periphery). And the arc spot is effectively returned to the evaporation surface at this portion utilizing the characteristic that the arc spot advances toward the direction of the acute angle formed between the cathode surface and the line of magnetic force. That is, the arc spot is returned at the portion near the cathode outer periphery before the arc spot moves to the slope, so that the arc spot can be returned to the evaporation surface more effectively than the conventional technology. Of course, the present invention also has the effect acquired by the slope of the tapered ring.

Further, in the present invention, since the front end of the ferromagnetic tapered ring adjacent to the front end of the cathode is sharpened, the magnetic flux density near the front end of the ferromagnetic tapered ring increases, and its magnetic field intensity becomes stronger than a magnetic field at ion generation place. An electron and an ion have a characteristic that they are suppressed for moving to a stronger magnetic field intensity area along a line of magnetic force. Thus, when the magnetic field near the front end of the tapered ring becomes strong, movement of the arc spot from this portion to the outside can be prevented.

According to the above synergetic effects, the effect of returning the arc spot to the evaporation surface can be further improved. That is, the force for pushing back the arc spot to the cathode evaporation surface 22a side is applied stronger than the force using a conventional paramagnetic ring, and the effect of pushing back the arc spot to the cathode evaporation surface before the arc spot reaches the tapered ring becomes stronger. This force becomes stronger as going to the front end of the tapered ring 64 because the magnetic flux density increases.

By these two synergetic effects, the arc spot 15 is pushed back to the cathode evaporation surface 22a before reaching the tapered ring 64, and the effect of suppressing movement of the arc spot to the cathode side face can be improved. Further, since the movement of the arc spot to the tapered ring surface is suppressed, the front end of the tapered ring is less consumed by arc discharge, and the shape of the tapered ring is kept for a long period of time. Thus, the effect of suppressing the movement of the arc spot to the cathode side face can be kept for a long period of time. Furthermore, a defect that a composition material of the tapered ring is evaporated by arc discharge and mixed into a film can be suppressed.

In addition, these effects are not affected by a degree of vacuum in a vacuum chamber in which arc discharge is carried out, and even when the arc discharge is carried out under vacuum in which carrier gas is not introduced, it is possible to acquire the similar effect to that in the case of introducing gas.

Effect by a Tapered Ring Cover

In the first embodiment, there are following effects acquired by using the tapered ring cover 65. That is, as shown in FIG. 2, when a negative charged high temperature droplet is scattered and reaches a portion near the conical face (slope) of the tapered ring 64, the droplet 16 is adhered to the surface of the tapered ring cover 65 because the tapered ring cover 65 covers the conical face. However, since the tapered ring cover 65 is insulated from the circumference, an electron adhered on the surface of the droplet is not discharged, and can not function as a trigger for starting arc discharge.

Further, if the cathode constituent material is deposited on the surface of the tapered ring cover 65, the function of the tapered ring cover 65 can be kept for a long period of time since electric insulation between the tapered ring 64 and the tapered ring cover 65 does not decrease.

Furthermore, since the tapered ring cover 65 is provided having a space between the tapered ring 64 and the tapered ring cover 65, heat flow from high temperature plasma formed by arc discharge to the tapered ring 64 can be suppressed, and thus reduction of magnetic permeability of the tapered ring 64 made of a ferromagnetic material can be prevented.

In addition, the similar effect can be acquired when an insulating material is coated on the surface of the tapered ring 64 by plating or thermal spraying, or an insulating material is attached to the surface of tapered ring 64 with an adhesive or an insulating screw instead of the tapered ring cover 65. Particularly, since the insulating material has not only low electric conductivity but low thermal conductivity, the heat flow from the high temperature plasma to the tapered ring can be suppressed more effectively.

Second Embodiment

Figure 3:
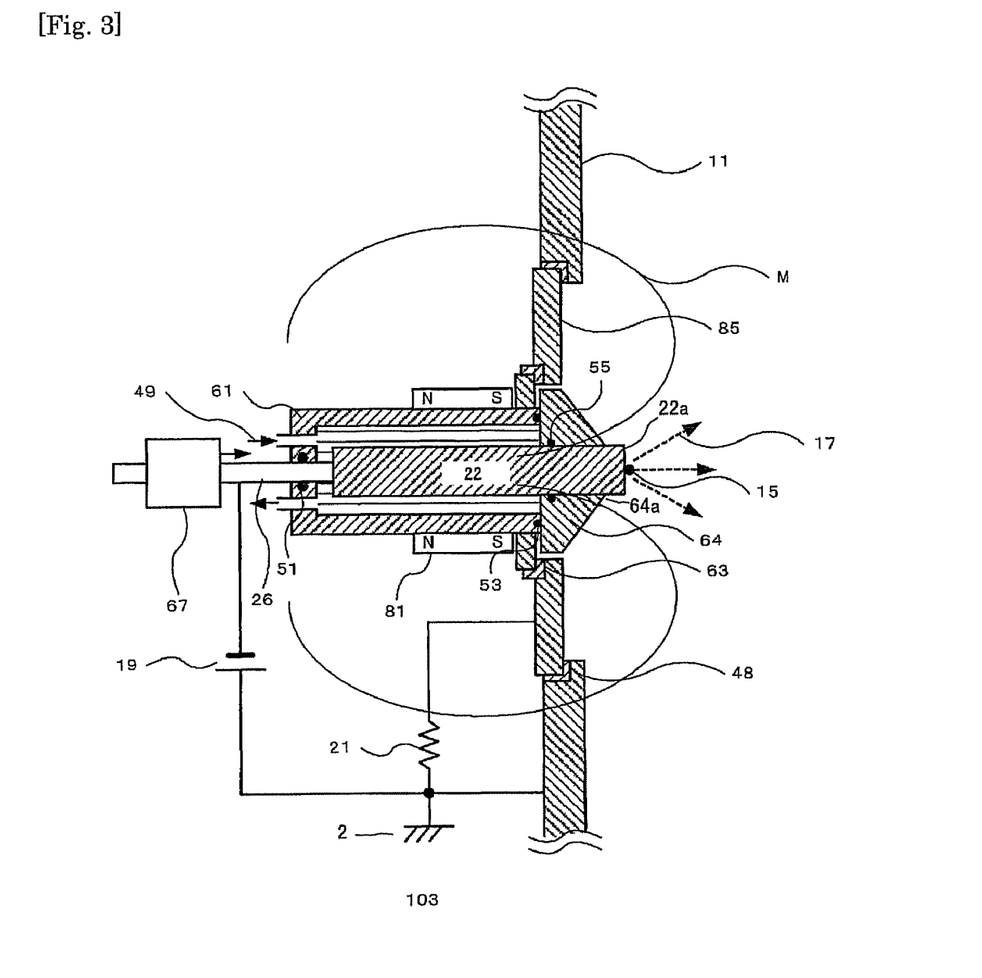
FIG. 3 is a cross-sectional view showing an arc plasma source of a second embodiment of the present invention.

FIG. 3 is a cross-sectional view showing a second embodiment of an arc plasma source of the present invention.

In FIG. 3, an arc plasma source has components similar to that of the first embodiment except a cylindrical electromagnet 81 is used as a magnetic field forming mechanism instead of the coil 42 and the tapered ring cover is not used. Now, same components as that of the first embodiment are denoted by the same reference numerals, and thus detailed description thereof will be hereinafter omitted.

However, the second embodiment does not have the coil housing case 46 since not using the coil 42, so that the arc plasma source 103 cannot be attached to an opening of the vacuum chamber 11 as it stands. Thus, a ring-shaped attaching plate (an intermediate potential electrode) 85 having the same outer diameter and inner diameter as those of the coil housing case 46 is used. By fitting the insulation rings 48 and 63 to an outer edge and inner edge of the attaching plate 85 respectively, the arc plasma source 103 can be set up similar to the first embodiment.

Further, in the second embodiment, since the coil 42 is not used, the exciting power source 44 is not necessary.

The cylindrical magnet 81 does not need to be wholly composed of a magnet. For example, a cylinder made of a ferromagnetic material is arranged outside the cathode 22 so as to be coaxial with the cathode 22, and a ring-shaped (cylindrical) magnet or a disk shaped magnet can be provided coaxially behind the cylinder. In this case, a magnetic field is formed by means of the cylindrical (disk shaped) magnet at the end of the ferromagnetic material, which is anterior to the cylindrical (disk shaped) magnet. Further, a magnetic pole is formed at another end of the ferromagnetic material. The end of the cylindrical (disk shaped) magnet and the end of the ferromagnetic material operate almost equal to the cylindrical magnet as a whole.

Further, the magnetic field intensity can be adjusted by adding a not-shown magnet to the outer periphery and/or behind of the cylindrical magnet 81. In addition, the cylindrical magnet can have a structure which can be divided into two or more parts so as to be easily attached and detached. The cylindrical magnet can be a cylindrical magnet group as a whole by arranging small circular pillar or square pillar type rod magnets circumferentially.

In addition, in the second embodiment, since a permanent magnet is used, a current source for an electromagnet is not necessary, so that the structure of the plasma source can be simplified. Further, since a strong magnetic field can be formed with a comparatively small magnet, the apparatus can be compact. By contrast, in the first embodiment, magnetic field intensity for stabilizing arc discharge can be easily adjusted by controlling current of an electromagnet.

Third Embodiment

Figure 4:
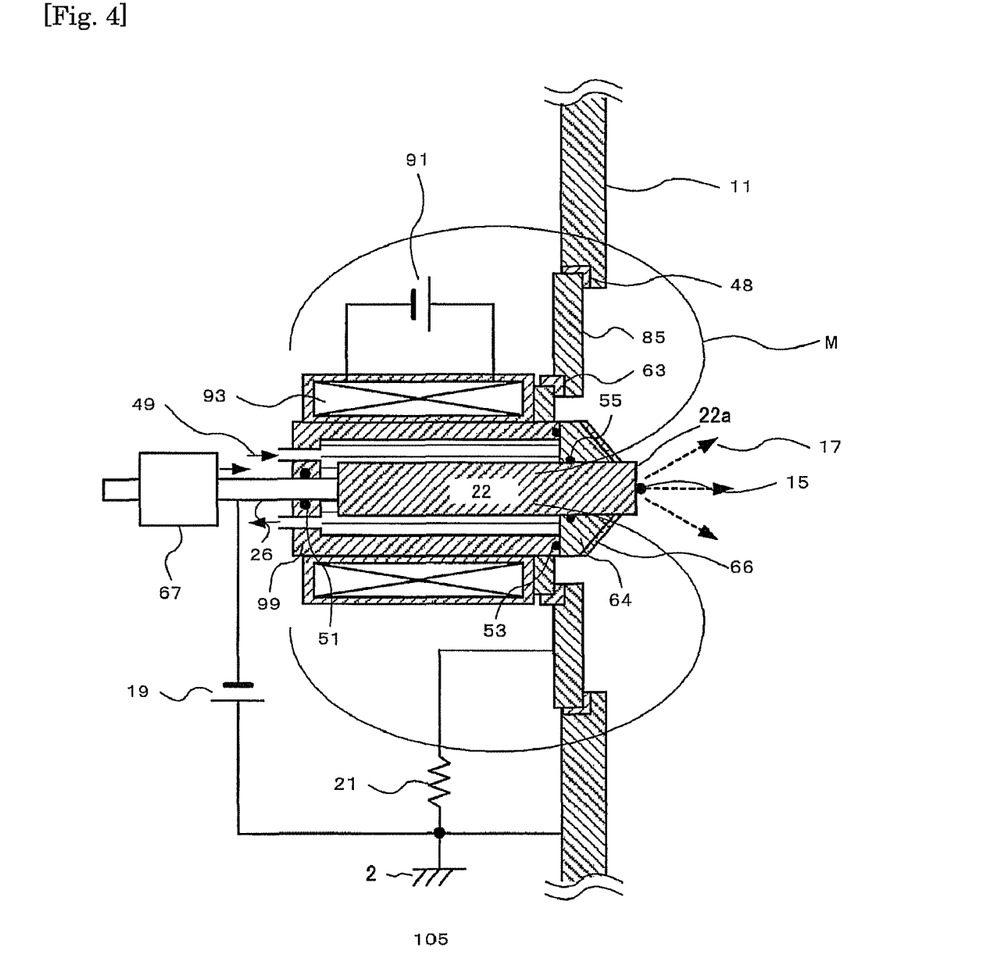
FIG. 4 is a cross-sectional view showing an arc plasma source of a third embodiment of the present invention.

FIG. 4 is a cross-sectional view showing a third embodiment of an arc plasma source of the present invention.

In FIG. 4, an arc plasma source has components similar to that of the second embodiment except a coil 93 is used as a magnetic field forming mechanism instead of the cylindrical electromagnet 81 and the surface of the conical face of the tapered ring 64 is covered with an insulating material 66. Now, same components as that of the second embodiment are denoted by the same reference numerals, and thus detailed description thereof will be hereinafter omitted.

In addition, a magnetic exciting power source 91 is provided according to a use of the coil 93.

Preferably, a ceramic such as alumina or silicon nitride having high heat resistance is used as the insulating material 66. The insulating material 66 can be coated on the surface of the conical face of the tapered ring 64 by a thermal spray coating or the like. When it is hard to coat the insulating material 66, tile shaped ceramic(s) can be adhered to the surface of the conical face of the tapered ring 64 or locked with a ceramic screw.

An effect acquired by covering the insulating material on the surface of the conical face of the tapered ring is already described in the first embodiment using the tapered ring cover.

The third embodiment is different from the first embodiment because a cooling mechanism 99 functions not as a simple coil but as a cylindrical iron core. The cooling mechanism 99 has a same structure as that of the cooling mechanism 61, but is made of a ferromagnetic material. In the third embodiment, since the cooling mechanism is used as a ferromagnetic iron core, a magnetic field stronger than that of the first embodiment can be acquired.

All of the composition materials of the cooling mechanism 99 do not need to be a ferromagnetic material and only a part of the cooling mechanism 99 (e.g., an outer face) can be made of a ferromagnetic material. Further, the cooling mechanism 99 is not made of a ferromagnetic material, and can be housed in a cylinder made of a ferromagnetic material. For example, when water is used as the coolant 49, the cathode cooling mechanism itself can be made of (nonmagnetic) stainless steel (SUS304) in which rust hardly generates, and the cathode cooling mechanism can be housed in a cylinder made of a ferromagnetic material.

As the ferromagnetic material, iron, nickel, cobalt, and an alloy mainly composed of them can be preferably used. A metal material has comparatively high thermal conductivity so that it is effective for cooling the tapered ring.

In addition, magnetic field intensity can be adjusted by changing current sent to the coil 93.

According to the arc plasma source corresponding to each embodiment of the present invention, since arc discharge is controlled at an area of the cathode evaporation surface, movement of the arc discharge to a portion other than the cathode evaporation surface can be suppressed.

Further, when a conical face of a tapered ring is coated with an insulating material, or provided with a tapered ring cover, temperature increase of the tapered ring by contacting with high temperature plasma formed by the arc discharge can be suppressed, and a decrease of a magnetic permeability of the tapered ring can be suppressed. Therefore, the effect of suppressing movement of the arc discharge can be improved greatly.

EXAMPLES

The present invention will be described in detail below with examples, but the present invention is not limited to these examples.

Example 1

An arc plasma source 101 shown in FIG. 1 was used. As a cathode 22, Cr (purity of 99.9%) having a diameter of 50 mm and a length of 120 mm was attached to the plasma source 101. A tapered ring 64 made of SS400 steel (JIS G3101) and having an inner diameter of 50.5 mm, an outer diameter of 90 mm, and an inclination of a conical face of 45°, was coaxially provided at a position behind an evaporation surface of the cathode 22. As for a tapered ring cover 65, a cover made of SUS304 and having a thickness of 1.5 mm was used.

The plasma source 101 was set up at an arc ion plating deposition apparatus and a chrome nitride film was deposited. As a substrate to be deposited, a high speed tool steel (SKH material) polished to have a surface roughness (at arithmetic mean roughness Ra) of 0.02 μm or less was used.

Before depositing a film, the substrate surface be deposited was subjected to an ion bombardment processing so as to clean the surface. The ion bombardment processing was carried out by evacuation of air to be $2.7 \times 10^{-3}$ Pa ($2 \times 10^{-5}$ Torr) or less in the vacuum chamber (the deposition apparatus), and introducing Ar gas at a flowing rate of $1.7 \times 10^{-2}$ Pa m$^3$/s (10 sccm (standard cc/min)) from a gas inlet hole which was not shown in the drawings, and keeping the inside of the vacuum chamber at about 1.3 Pa (10 mTorr). Then, high frequency electric power having frequency of 13.56 MHz and electric power of 100 W was applied to the substrate to be deposited for 10 minutes via an impedance matching apparatus, which was not shown in the drawings, so as to generate high frequency plasma discharge. The substrate to be deposited was negatively self-biased due to adhesion of electrons from the plasma, and an Ar ion as a positive ion was accelerated and sputters the substrate surface. Then, the surface was cleaned.

After the ion bombardment processing, a deposition process was carried out. Nitrogen gas was introduced into the vacuum chamber and the inside of the vacuum chamber was kept at 2.6 Pa. Then, arc current of 100 A was applied to the cathode so as to generate arc discharge, and simultaneously direct-current voltage (−20V) was applied to the substrate to be deposited. While keeping this state, deposition was carried out for 60 minutes.

This process was repeated 20 times while exchanging the substrate to be deposited. Then, the film quality of the 20th deposited substrate was evaluated, and the trace of the arc discharge on the surface of the tapered ring 64 was observed. In addition, a maintenance of the deposition apparatus and the arc plasma source 101 were not carried out except exchanges of the cathode 22 provided at the arc plasma source during the deposition process which was carried out 20 times.

Example 2

A film was deposited and evaluated by a process similar to the process of Example 1 except an arc plasma source 103 shown in FIG. 3 was used instead of the arc plasma source 101. However, a S50S steel (JIS G4051) was used as a material of the tapered ring 64.

Example 3

A film was deposited and evaluated by a process similar to the process of Example 1 except an arc plasma source 105 shown in FIG. 4 was used instead of the arc plasma source 101. However, the surface of the conical face of the tapered ring 64 was coated with an insulation ceramic which was thermal sprayed with alumina to have a thickness of 0.2 mm.

Example 4

A film was deposited and evaluated by a process similar to the process of Example 1 except followings. That is, a hard carbon (DLC) film was deposited using carbon (graphite; purity of 99.9%) having the same size of Cr as the cathode 22 instead of the Cr, the tapered ring 64 was made of SS400 steel, the cathode 22 was housed in a cylinder not shown in the drawings, made of SUS304 and having a thickness of 1 mm, so that the cathode was not directly contact with cooling water and was made to be indirectly cooled.

And, the gas to be introduced in the deposition process was changed to Ar gas, the pressure inside the vacuum chamber was changed to 0.02 Pa, and the direct-current voltage applied to the substrate to be deposited was changed to −100V.

Example 5

A film was deposited and evaluated by a process similar to the process of Example 4 except an arc plasma source 103 shown in FIG. 3 was used instead of the arc plasma source 101.

However, Ar gas was not introduced in the deposition process.

Example 6

A film was deposited and evaluated by a process similar to the process of Example 4 except an arc plasma source 105 shown in FIG. 4 was used instead of the arc plasma source 101.

However, the tapered ring cover 65 was not used but an insulating material acquired by locking silicon nitride tiles having thickness of 1.5 mm with an alumina screw was used on the surface of the conical face of the tapered ring 64.

Further, Ar gas was not introduced in the deposition process.

Comparative example 1

A film was deposited and evaluated by a process similar to the process of Example 2 except a material of the tapered ring 64 is changed to paramagnetic Cr (purity of 99.9%).

Comparative example 2

A film was deposited and evaluated by a process similar to the process of Example 2 except a material of the tapered ring 64 is changed to paramagnetic carbon (graphite; purity of 99.9%).

Evaluation

The chrome nitride film and the hard carbon film formed on the surface of the substrate to be deposited were evaluated as follows.

1. Surface Roughness (a Ten-Point Average Roughness): Rz (JIS-B0601)

The surface roughness Rz on the film surface was measured according to JIS-B0601 using a contact (stylus) roughness gauge. The surface roughness was measured 5 times changing a measuring position, and its average value was evaluated.

2. Film Thickness Uniformity

Arbitrary 5 areas each having a square of 0.5 mm×0.5 mm on the film surface were selected and the surface shape was observed using a laser interference type three-dimensional shape measuring apparatus (Laser Microscope OLI1100, produced by Olympus Corporation). In the acquired profiles, total numbers of extremely thin film thickness parts and extremely thick film thickness parts having a size (the maximum length part) of 0.05 mm or more were counted. The extremely thin film thickness part (the extremely thick film thickness part) indicates an area wherein a bump being more than 20% of the average film thickness is formed. When the extremely thin film thickness part or the extremely thick film thickness part having a size of 0.05 mm or more is formed, exfoliation may arise with this part as the origin, or the friction action on the counterpart material may increase so that the abrasion of the counterpart material increases.

In addition, as for the average film thickness, film thicknesses at arbitrary 10 places on the film surface were measured by a spherical surface polishing method (a ball polishing method), and an average value of the thicknesses was made to be the average film thickness. Since the extremely thin film thickness part and the extremely thick film thickness part have distinct bumps comparing with other parts (the average film thickness part), these can be confirmed with a profile of the surface shape.

3. Observation of Trace of Arc Discharge on a Tapered Ring Surface

The tapered ring surface was observed visually so as to confirm the presence of the trace of arc discharge.

The evaluated results were shown in Table 1.

TABLE 1

| | | | Evaluations | | |
|---|---|---|---|---|---|
| | Material of Tapered Ring | Protection of Tapered Ring | Surface Roughness Rz (um) | Film Thickness Uniformity (extremely thin or thick film thickness part) | Arc Discharge Trace |
| Example 1 | SS400 Steel (Ferromagnetic) | Tapered Ring Cover | 0.7 | Not confirmed | Not confirmed |
| Example 2 | S50C Steel (Ferromagnetic) | — | 0.5 | Not confirmed | 3 places on the conical face |
| Example 3 | SS400 Steel (Ferromagnetic) | Alumina Coating | 0.5 | Not confirmed | Not confirmed |
| Example 4 | SS400 Steel (Ferromagnetic) | Tapered Ring Cover | 0.9 | Not confirmed | Not confirmed |
| Example 5 | SS400 Steel (Ferromagnetic) | — | 0.4 | Not confirmed | 2 places on the conical face |
| Example 6 | SS400 Steel (Ferromagnetic) | Silicon Nitride Tiles | 0.7 | Not confirmed | Not confirmed |
| Comparative example 1 | Cr (Paramagnetic) | — | 2.1 | 9.8 places | Whole periphery on the front end and 15 places on the conical face |
| Comparative example 2 | Carbon (Paramagnetic) | — | 3.8 | 14.6 places | Whole periphery on the front end and 28 places |

TABLE 1-continued

| Material of Tapered Ring | Protection of Tapered Ring | Surface Roughness Rz (um) | Film Thickness Uniformity (extremely thin or extremely thick film thickness part) | Arc Discharge Trace |
|---|---|---|---|---|
| | | | | on the conical face |

As clearly shown from Table 1, in each Example the surface roughness (Rz) of the film was small, the extremely thin film thickness part or the extremely thick film thickness part was not confirmed, and the film thickness uniformity was good.

Particularly, movement of arc to the tapered ring conical face was not confirmed at all in Examples 1 and 4 in which the tapered ring cover was provided ahead of the tapered ring and in Examples 3 and 6 in which the surface of the tapered ring conical face was covered with an insulating material.

Further, the traces of arc discharge were confirmed at some places on the tapered ring conical face in Examples 2 and 5, but the number of the traces was greatly reduced comparing Comparative examples 1 and 2.

On the other hand, in Comparative example 1 and Comparative example 2 in which the paramagnetic tapered ring was used, the surface roughness (Rz) of the film increased, and the extremely thin film thickness part or the extremely thick film thickness part were confirmed on the film surface. The number of the traces of arc discharge to the tapered ring conical face increased several times comparing Examples.

Further, in each Comparative example, the traces due to the temporary movement of arc discharge were confirmed on the tapered ring conical face, and particularly on the whole periphery at the front end of the tapered ring. Furthermore, a lot of arc traces were confirmed on the conical face apart from the front end of the tapered ring. The latter arc traces were not connected with the arc traces at the front end of the tapered ring, and thus it was confirmed that both arc discharges move separately.

What is claimed is:

1. An arc plasma source for evaporating a cathode material of a cathode by arc discharge controlled by a magnetic field, the source comprising:
    the cathode;
    a magnetic field forming mechanism arranged outside the cathode for forming a magnetic field in parallel to the center axis of the cathode near an evaporation surface at the front end of the cathode;
    a supporting mechanism for supporting the cathode;
    a cooling mechanism for cooling the cathode; and
    a tapered ring being truncated cone shaped and having a through-hole into which the cathode penetrates along the axial direction of the through-hole, the tapered ring being arranged to be tapered toward the evaporation surface of the cathode;
    wherein the tapered ring is made of a ferromagnetic material and the front end of the tapered ring is positioned coplanar with the evaporation surface of the cathode or is positioned posterior to the evaporation surface in use.

2. The arc plasma source according to claim 1, further comprising an insulating material provided on a surface of the conical face of the tapered ring.

3. The arc plasma source according to claim 1, further comprising a ring-shaped cover made of a paramagnetic metal or a paramagnetic alloy provided anterior to the conical face of the tapered ring, wherein the ring-shaped cover has a through-hole into which the cathode penetrates along the axial direction of the through-hole, and the ring-shaped cover is electrically insulated from other parts.

4. The arc plasma source according to claim 1, wherein the magnetic forming mechanism comprises a coil, a cylindrical permanent magnet having a magnetic pole in an axial direction, or an electromagnet having an iron core and a coil.

5. The arc plasma source according to claim 2, wherein the magnetic forming mechanism comprises a coil, a cylindrical permanent magnet having a magnetic pole in an axial direction, or an electromagnet having an iron core and a coil.

6. The arc plasma source according to claim 3, wherein the magnetic forming mechanism comprises a coil, a cylindrical permanent magnet having a magnetic pole in an axial direction, or an electromagnet having an iron core and a coil.

7. The arc plasma source according to claim 1, further comprising a cathode feeding mechanism moving backward and forward the cathode in its axial direction.

8. The arc plasma source according to claim 2, further comprising a cathode feeding mechanism moving backward and forward the cathode in its axial direction.

9. The arc plasma source according to claim 3, further comprising a cathode feeding mechanism moving backward and forward the cathode in its axial direction.

10. The arc plasma source according to claim 4, further comprising a cathode feeding mechanism moving backward and forward the cathode in its axial direction.

* * * * *